United States Patent
Zhang

(10) Patent No.: US 7,807,501 B1
(45) Date of Patent: Oct. 5, 2010

(54) INTEGRATED CIRCUIT PACKAGE AND APPARATUS AND METHOD OF PRODUCING AN INTEGRATED CIRCUIT PACKAGE

(75) Inventor: Leilei Zhang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/466,248

(22) Filed: May 14, 2009

Related U.S. Application Data

(62) Division of application No. 11/250,945, filed on Oct. 14, 2005, now Pat. No. 7,652,369.

(51) Int. Cl.
*H01L 21/44* (2006.01)

(52) U.S. Cl. .............................. 438/108; 257/E21.551

(58) Field of Classification Search ................ 438/108, 438/112; 257/E21.503, E21.551
See application file for complete search history.

(56) References Cited

U.S. PATENT DOCUMENTS 7,078,800 B2 * 7/2006 Kwon et al. ................ 257/704
7,187,123 B2   3/2007 MacPherson
2007/0018539 A1   1/2007 Nagashima

OTHER PUBLICATIONS

U.S. Appl. No. 11/250,945, filed Oct. 14, 2005, Zhang, L., Xilinx, Inc., 2100 Logic Drive, San Jose, California.

* cited by examiner

*Primary Examiner*—Quoc D Hoang
(74) *Attorney, Agent, or Firm*—John J. King

(57) ABSTRACT

An integrated circuit package is disclosed. The integrated circuit package comprises an integrated circuit die having a plurality of solder bumps; and a substrate comprising a first plurality of contact pads on a first surface and a second plurality of contact pads on a second surface. The plurality of solder bumps on the integrated circuit die is coupled to the first plurality of contact pads on the first surface of the substrate, wherein at least one edge of the substrate is formed after the integrated circuit die is attached to the substrate. According to one embodiment of the invention, the at least one edge of the substrate is formed after excess substrate material is detached at designated areas. According to another aspect of the invention, an assembly fixture is disclosed. An apparatus and method for assembling an integrated circuit package are also disclosed.

19 Claims, 6 Drawing Sheets

INTEGRATED CIRCUIT PACKAGE AND APPARATUS AND METHOD OF PRODUCING AN INTEGRATED CIRCUIT PACKAGE

FIELD OF THE INVENTION

The present invention relates generally to integrated circuit packages, and to an apparatus and method of producing an integrated circuit package.

BACKGROUND OF THE INVENTION

In manufacturing integrated circuit devices, it is important that the devices are defect free at the time of production, and reliable throughout their use. When defects are found in completed integrated circuit devices, the percentage of usable devices decreases, and the profitability of the manufacturer suffers, either through waste or required reworking. More importantly, when a semiconductor device fails after being installed, such a failure may cause an entire consumer electronics device to fail. That is, the failure of a single integrated circuit device may render an entire consumer electronics device unusable. Accordingly, it is important that manufacturers minimize defects in integrated circuit devices whenever possible.

One common source of failures in integrated circuit devices is found where components are soldered to contact pads, such as solder bumps of a flip chip ball grid array (BGA). A ball grid array is an advanced integrated circuit package comprising a substrate having contacts on the bottom for soldering the integrated circuit package to a circuit board. A wire bond BGA comprises a die having contact pads which are bonded to a contact pads on the surface of the substrate by way of wire bonds. In contrast, a flip chip BGA comprises a die having contact pads which are directly bonded to the substrate using solder bumps. Unlike in a wire bond BGA, the die having solder bumps is flipped over and placed face down in a flip chip BGA, with the conductive bumps connecting directly to corresponding contact pads on the top surface of the substrate. Many components of integrated circuit package are soldered to contact pads using solder balls which are reflowed when the component is placed. For example, a flip chip having contact pads is soldered to a substrate by reflowing a plurality of solder balls on the contact pads of the flip chip. One common cause of failures in soldering a flip chip to a substrate of an integrated circuit package may result from variations in the shape of the package. For example, warping of the package during the processing steps may lead to height variations between the contact pads on the flip chip die and contact pads of the substrate. Such warpage may cause weaker solder bonds where the height difference is excessive or where movement occurs as a result of warping during the reflowing process.

Variations in the integrated circuit package, other than warping, may also be introduced during the assembly of the integrated circuit package, such as the application of underfill or during lid attachment. Efforts are currently being made to reduce the warpage of the parts by changing materials used in the integrated circuit package. While these efforts may help reduce warpage, conventional devices continue to have defects, particularly as die sizes in flip chip packages increase. Further, some efforts to reduce warpage have reliability trade-offs. For example, by reducing the stresses in the underfill material to reduce warpage, the solder bumps themselves become exposed to additional stresses.

There have also been efforts to reduce the core thickness of a substrate to reduce the cost of the substrate and increase the electrical performance. However, a thin substrate warps easily during the assembly process when thermal stress is generated in the die due to different thermal coefficients of the substrate and die. Package warpage may often occur during package assembly process including lid attachment and ball placement due to the different thermal coefficients. As a result of various thermal stresses during the assembly process, a non-wet solder bump may be formed, which may result in an electrical open in the final product.

Accordingly, there is a need for an improved integrated circuit package and an apparatus for and method of assembling an integrated circuit package.

SUMMARY OF THE INVENTION

An integrated circuit package is disclosed. The integrated circuit package comprises an integrated circuit die having a plurality of solder bumps; and a substrate comprising a first plurality of contact pads on a first surface and a second plurality of contact pads on a second surface. The plurality of solder bumps on the integrated circuit die is coupled to the first plurality of contact pads on the first surface of the substrate, wherein at least one edge of the substrate is formed after the integrated circuit die is attached to the substrate. According to one embodiment of the invention, the at least one edge of the substrate is formed after excess substrate material is detached at designated areas, such as recesses in the substrate, after the integrated circuit die is attached to the substrate. According to another aspect of the invention, the substrate comprises regions, associated with regions of the excess substrate which are detached after the die is attached to the substrate, adapted to receive at least one coupling member of an assembly fixture.

According to an alternate embodiment, an apparatus for producing an integrated circuit package is disclosed. The apparatus comprises a substrate having excess material to be detached in a finished integrated circuit package, and an assembly fixture adapted to receive the substrate. In some embodiments, the assembly fixture may comprise a first assembly fixture having at least one coupling member for retaining the substrate. The at least one coupling member of the first assembly fixture may comprise prongs, for example, wherein the excess material to be detached comprises recesses for receiving the prongs. The assembly fixture of the apparatus preferably comprises a second assembly fixture, which may comprise recesses for receiving the prongs of the first assembly fixture for retaining the substrate.

A method of assembling an integrated circuit package is disclosed. The method comprises steps of coupling a substrate having excess material to be detached during the assembly process to a first assembly fixture; attaching an integrated circuit die having a plurality of solder bumps to the substrate; reflowing the plurality of solder bumps; and detaching the excess material from the substrate. According to another aspect of the invention, the substrate is attached to a plurality of coupling members, and a second assembly fixture is attached to the first assembly fixture, such as by attaching the second assembly fixture to the coupling members. Finally, a lid may be attached to the substrate while the substrate is in the assembly fixture.

DETAILED DESCRIPTION OF THE DRAWINGS

Figure 1:
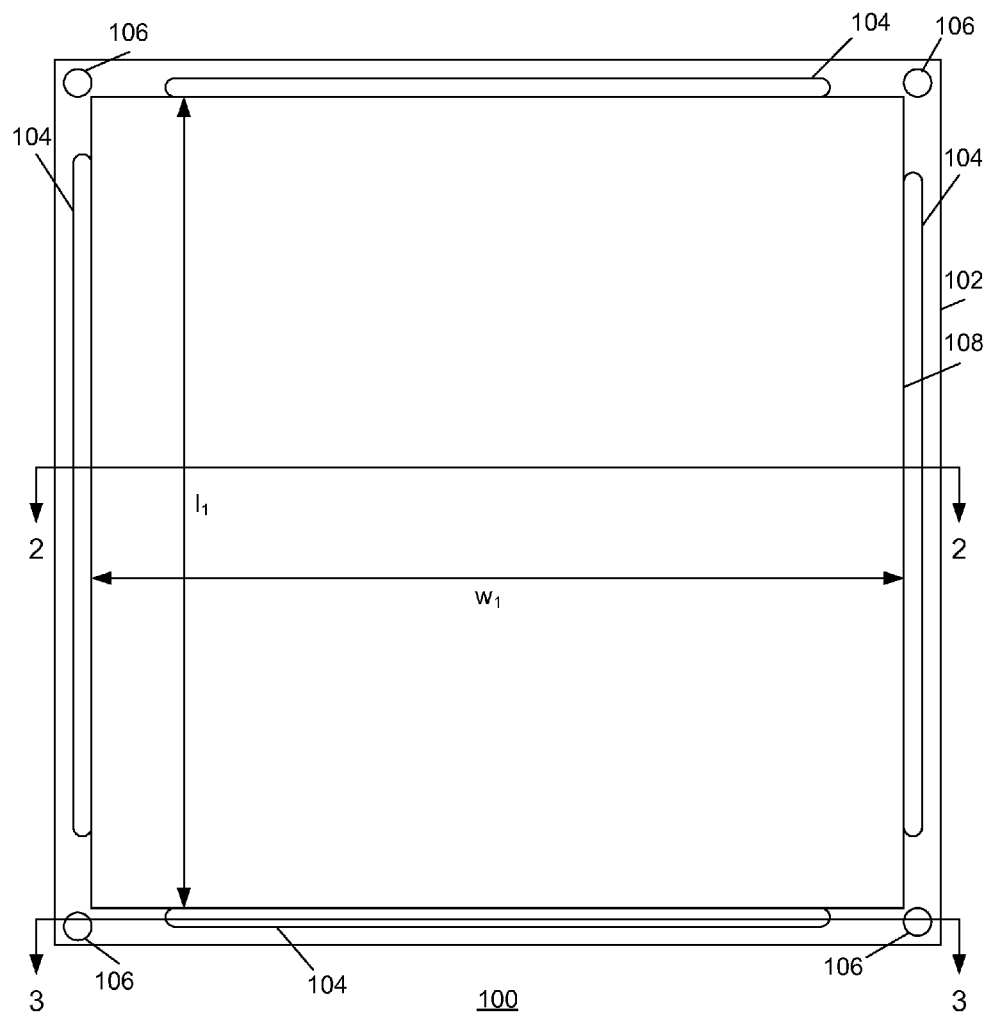
FIG. 1 is a top plan view of an integrated circuit package according to an embodiment the present invention.

Turning first to FIG. 1, a top plan view of an integrated circuit package 100 according to an embodiment the present invention is shown. In particular, a substrate 102 comprises a plurality of detachment guides 104, shown here as recesses, which provide a designation for detaching excess substrate material, as will be described in more detail below. Recesses 106 positioned on each of the four corners are adapted to receive coupling members of an assembly fixture, described in reference to FIGS. 5 and 6. A lid 108 having dimensions $l_1$ by $w_1$ is also positioned on top of the substrate within the edges of the substrate, and in particular within the detachment guides 104.

Figure 2:
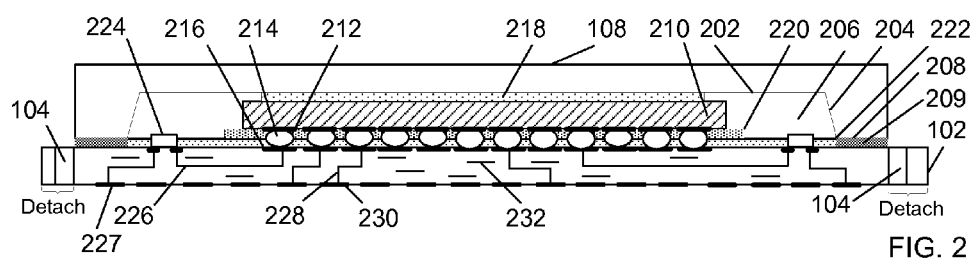
FIG. 2 is a cross-sectional view of the integrated circuit package of FIG. 1 taken at lines 2-2 according to an embodiment of the present invention.
Figure 3:
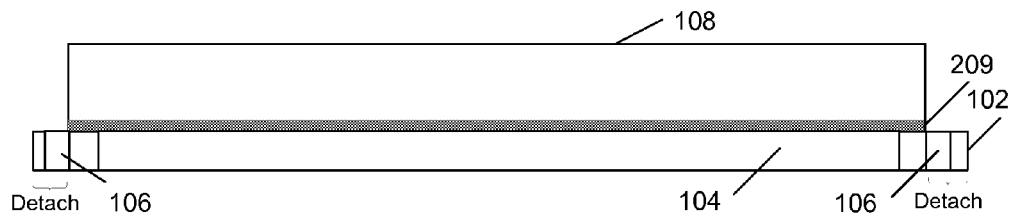
FIG. 3 is a cross-sectional view of the integrated circuit package of FIG. 1 taken at lines 3-3 according to an embodiment of the present invention.

As shown in the cross-sectional view of FIG. 2, the lid comprises an inner surface 202 and inner walls 204 forming a recess 206. The lid further comprises a foot portion 208 coupled to the substrate by a bonding agent 209, such as an adhesive. An integrated circuit die 210, shown here as a flip chip die, has a plurality of contact pads 212 and corresponding solder bumps 214 which make contact with contact pads 216 of the substrate. An adhesive 218 may also be used above the integrated circuit die 210, and an underfill 220 may be used below the integrated circuit die. A solder mask 222 may also be used during the assembly process, as is well known in the art. As is also shown, the substrate is a multilayer substrate having conductors formed on a plurality of layers. As can be seen in the cross-sectional view, a capacitor 224 on the surface of the substrate may be coupled to the integrated circuit die by a conductor 226 on a layer of the substrate. The capacitor may also be coupled to a contact 227 on the bottom portion of the substrate. Other conductors 228 may extend directly from contact pads on the top of the substrate to contact pads on the bottom of the substrate according to substrate artwork created for the substrate. The substrate artwork defines the various conductors so that the proper connections are made from the contact pads of the integrated circuit die (by way of the solder bumps and contact pads on the top of the substrate) to the contacts on the bottom of the substrate. Conductors 232 in various layers are also shown. Shown on the sides of the lid is the excess substrate material to be detached after the integrated circuit die is attached. Also visible in the cross-section of FIG. 3 are the detachment guides 104 and the recesses 106.

Figure 4:
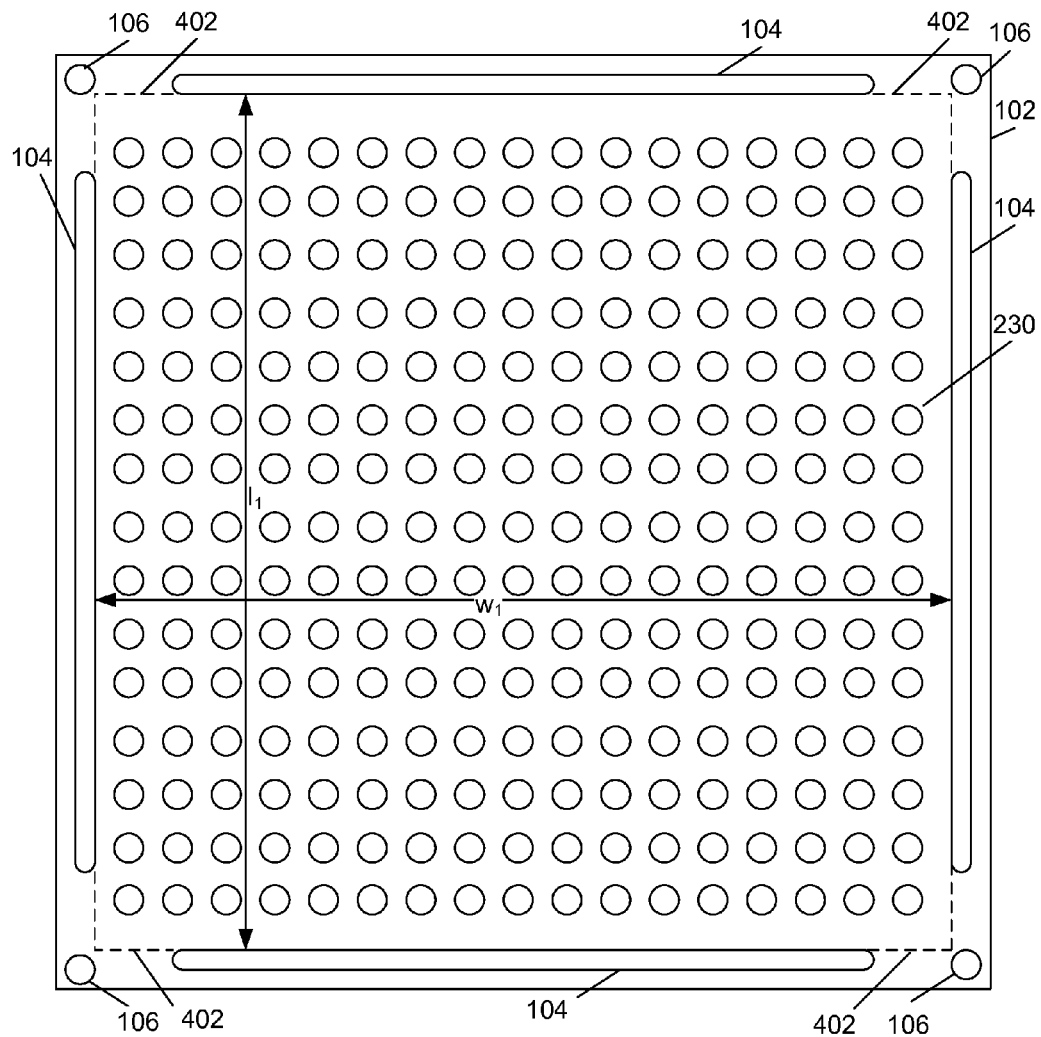
FIG. 4 is a bottom plan view of the integrated circuit package of FIG. 1 according to an embodiment of the present invention.

Turning now to FIG. 4, a bottom plan view of the integrated circuit package of FIG. 1 according to an embodiment of the present invention is shown. Dashed lines 402 indicate the areas which need to be cut to detach the excess substrate material. Because the detachment guides 104 are recesses, the substrate only needs to be cut at the dashed lines 402. Although the detachment guides are shown here having a certain width and length, the detachment guides may have other widths or lengths, or may be multiple detachment guides, such as multiple recesses staggered along the edges. Alternatively, the dashed lines may extend between the ends of the integrated circuit die, indicating the areas to be cut and eliminating the need for the detachment guides. The excess substrate material may also be removed using any suitable method of detaching a portion of a substrate, such as sawing or punching off the excess material. Finally, although the recesses 106 are shown as cylindrical recesses on the corners of the substrate, other forms of recesses may implemented at other portions of the die. For example, the recesses may be implemented on opposing portions of the substrate, such as on opposite sides or opposite corners of the substrate, or at any locations along the substrate, and may be any shape, such as rectangular or oval. While the width of the material to be detached may be any width, the width is preferably selected as a minimum width to enable securing the substrate, as will be described in detail in reference to FIGS. 5-8, in order to maximize die yield for a given wafer while minimizing any increase in cost.

Figure 5:
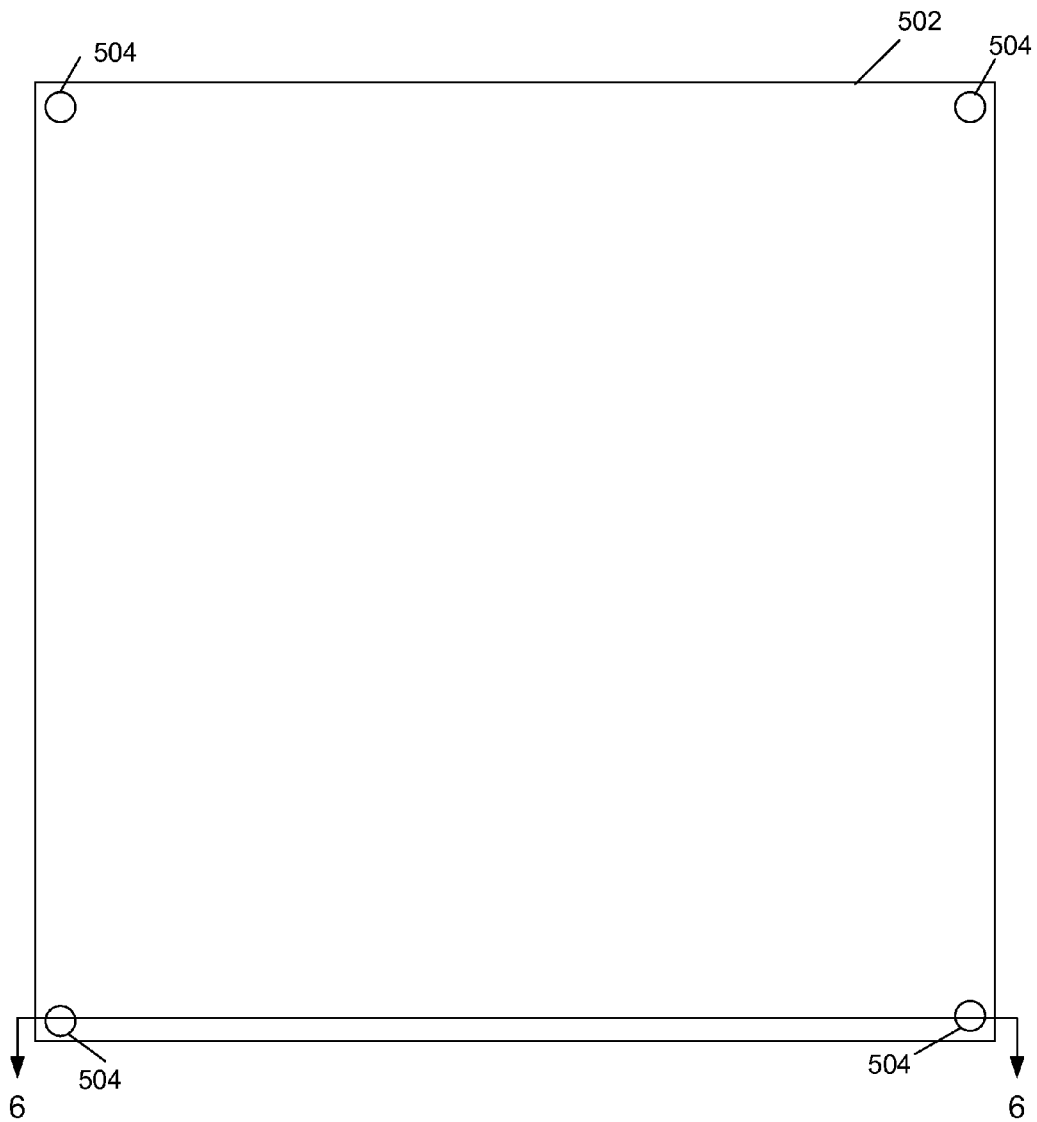
FIG. 5 is a top plan view of a first assembly fixture of according to an embodiment of the present invention.
Figure 6:
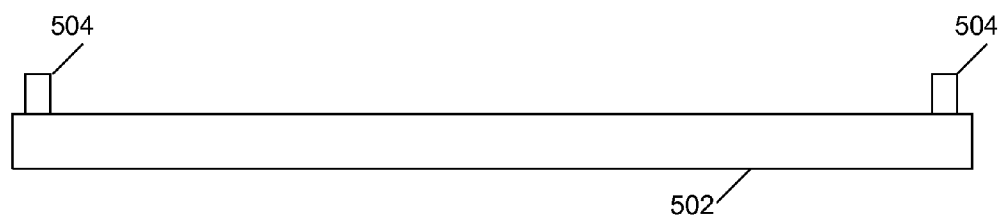
FIG. 6 is a cross-sectional view of the first assembly fixture of FIG. 5 taken at lines 6-6 according to an embodiment of the present invention.
Figure 7:
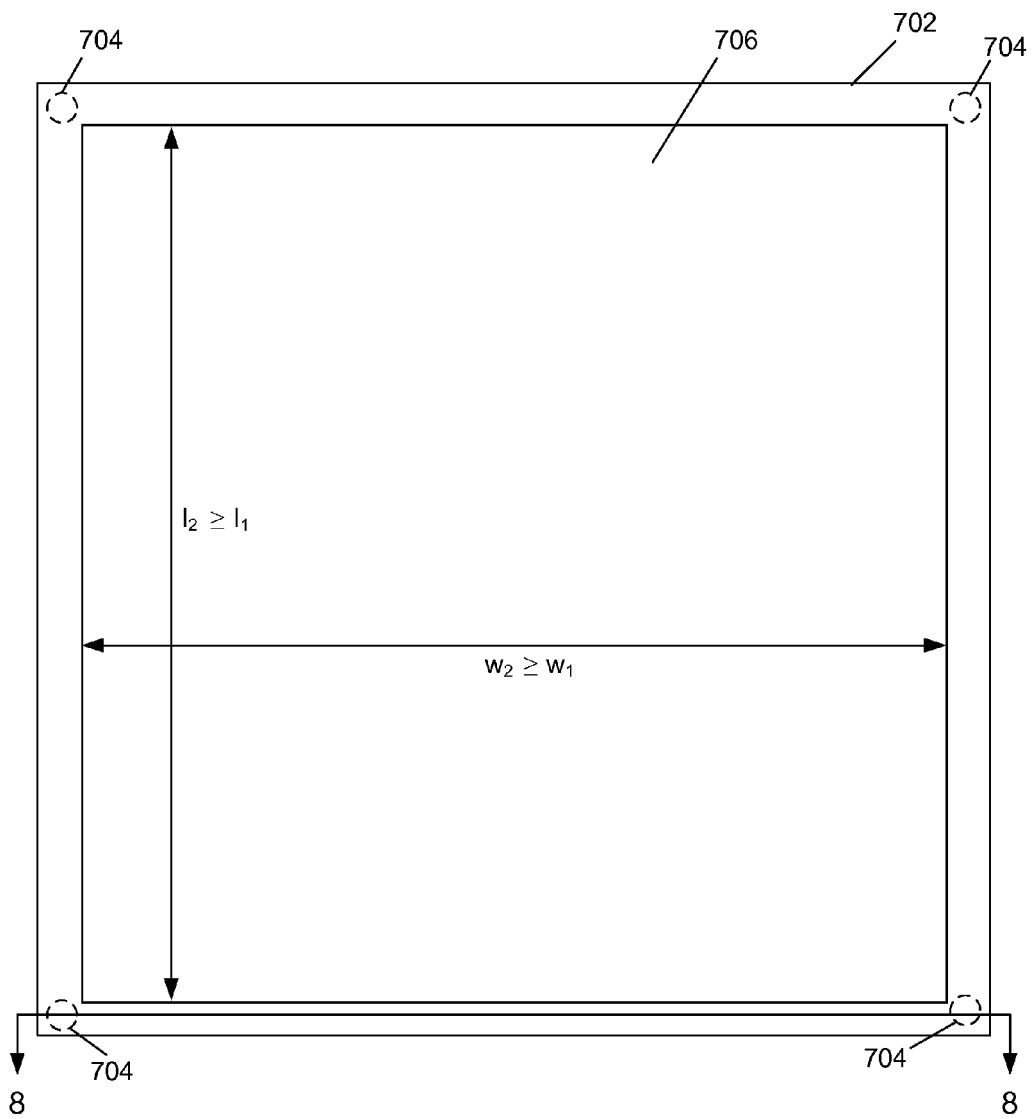
FIG. 7 is a top plan view of a second assembly fixture of according to an embodiment of the present invention.
Figure 8:
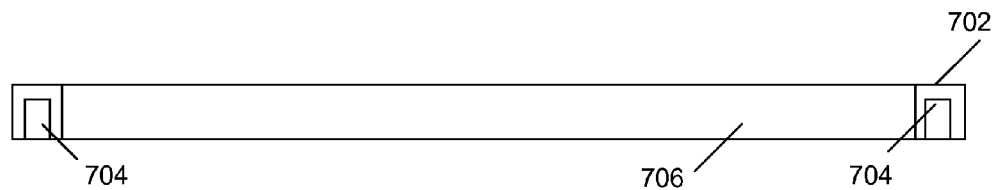
FIG. 8 is a cross-sectional view of the second assembly fixture of FIG. 7 taken at lines 8-8 according to an embodiment of the present invention.
Figure 9A:
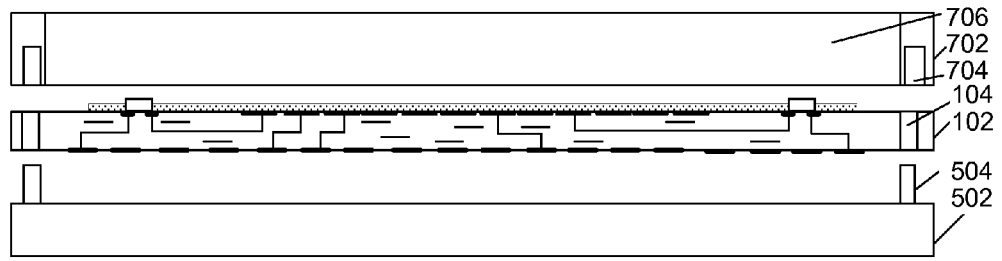
FIG. 9 is a series of figures showing a method of attaching an integrated circuit die and a lid to a substrate according to an embodiment of the present invention.
Figure 9B:
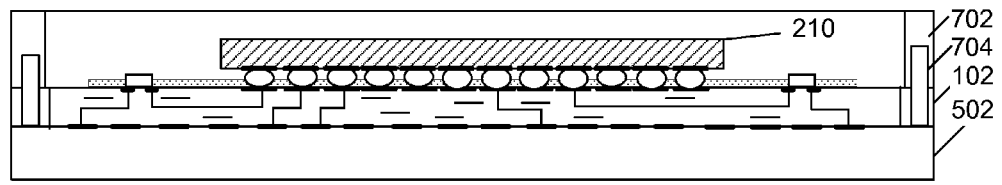
Figure 9C:
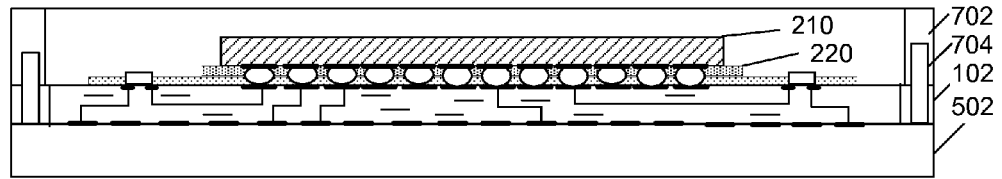
Figure 9D:
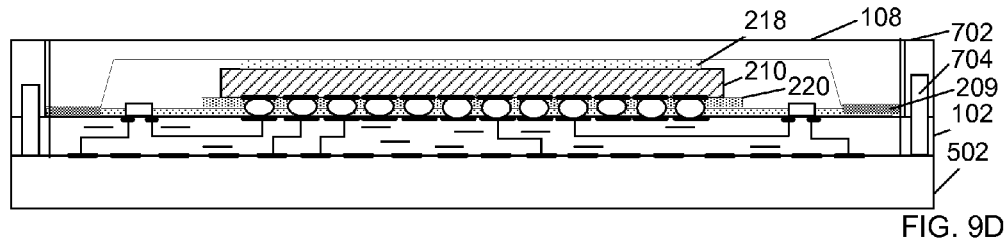
Figure 9E:
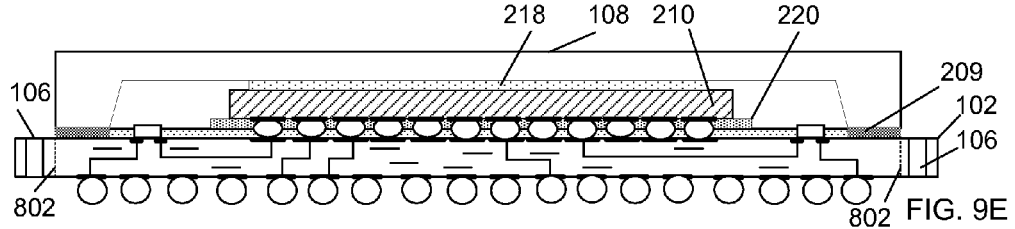
Figure 9F:
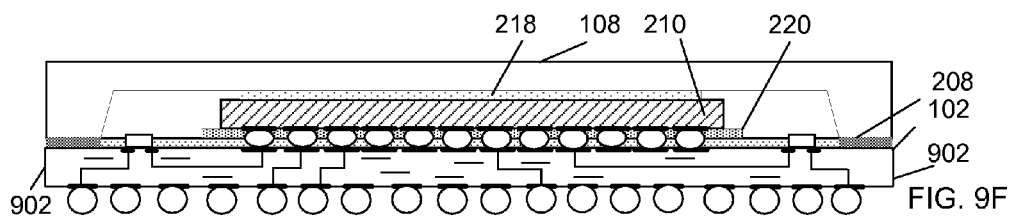

Turning now to FIG. 5, a top plan view of a first assembly fixture 502 according to an embodiment of the present invention is shown. The first assembly fixture 502 comprises prongs 504, also shown in the cross-sectional view taken at lines 6-6. When the prongs 504 are inserted into recesses 106 of the substrate, the substrate is held in place to prevent warpage during the assembly process. A second assembly fixture 702, shown in FIG. 7, may also be preferably used. In particular, the second assembly fixture 702 comprises recesses 704, shown in dashed lines in the top plan view of FIG. 7 and visible in the cross-sectional view of FIG. 8. The recesses are adapted to receive the prongs 504 when the second assembly fixture is attached to the first assembly fixture 502 of FIG. 5, as will be described in more detail in reference to FIG. 9. The second assembly fixture may also comprise a window 706 to allow the die and the lid to be attached to the substrate when the substrate is coupled between the first and second assembly fixtures. As shown, the window is at least the same dimensions as the lid to allow the lid to be attached to the substrate when the second assembly fixture is used, but may be larger. By providing a window with dimensions which are the same as the lid, the walls of the second assembly fixture may act as a guide for properly positioning the lid on the substrate. Although prongs 504 are shown to secure the substrate in FIGS. 5-8 between the first and second assembly fixtures, other coupling elements may be used to secure the substrate between the first and second assembly fixtures. For example, the substrate may be positioned between the two assembly fixtures which may be clamped together, eliminating any modification to the substrate other than providing the excess material of the substrate to allow the assembly fixtures to secure the substrate to reduce warpage. The first and second assembly fixtures may be held in place by a magnetic force of oppositely polarized magnetic elements associated with the corresponding assembly fixtures. Alternatively, corresponding coupling members on the first and second assembly fixtures, such as elements of a latch, may be used to secure the second assembly fixture to the first assembly fixture.

Turning now to FIG. 9, a series of figures shows a method of attaching an integrated circuit die and a lid to a substrate according to an embodiment of the present invention. In particular, a substrate, such as substrate 102, and an assembly fixture, such as first and second assembly fixtures 502 and 702, are shown in an expanded view in FIG. 9A. As shown in the collapsed view of FIG. 9B, the prongs 504 of the first assembly fixture extend into both the recesses 104 of the substrate and the recesses 704 of the second assembly fixture. The die 210 is attached to the substrate, and reflowed. As described above, the first and second assembly fixtures are coupled together to reduce or prevent warpage of the substrate during reflow of the solder bumps, enabling good solder contacts to form between the integrated circuit die and the substrate. An underfill 220 may be provided under the die and then cured as shown in FIG. 9C, where the first and second assembly fixtures also reduce or prevent warpage of the substrate during the curing process. A lid 108 may then be attached to the substrate as shown in the embodiment of FIG. 9D. The substrate having the integrated circuit die and the lid is then removed from the first and second assembly fixtures, as shown in FIG. 9E. Finally, the excess substrate material is detached from the integrated circuit package at dashed lines 802 to form edges or ends 902 of the substrate as shown in FIG. 9F. Although a particular order of assembling the integrated circuit package is shown in FIGS. 9A-F, the integrated circuit package may be assembled in other orders. For example, the lid may be attached after the substrate having the integrated circuit die attached is removed from the assembly fixtures.

Figure 10:
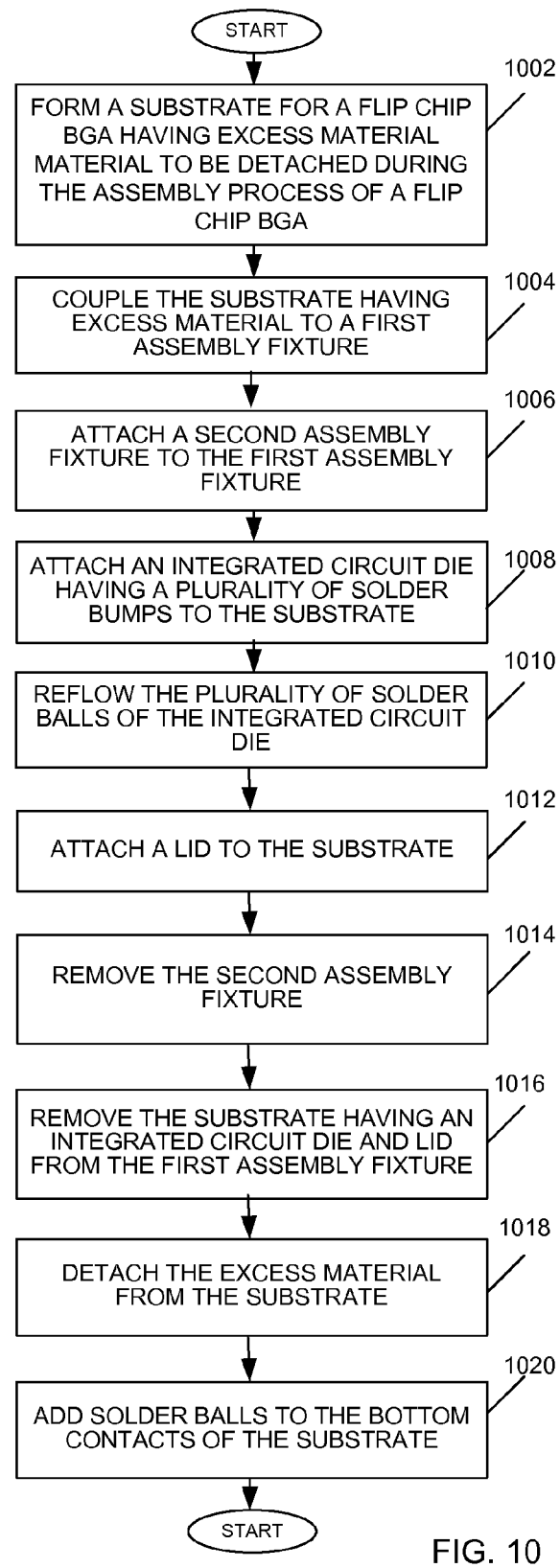
FIG. 10 is a flow chart showing a method of assembling a flip chip integrated circuit package according to an embodiment the present invention.

Finally, turning to FIG. 10, a flow chart shows a method of assembling a flip chip integrated circuit package according to an embodiment the present invention. The method of FIG. 10 may be employed with a variety of integrated circuit packages, such as those described in FIGS. 1-4, or other suitable devices, and may be assembled using any suitable assembly equipment, such as the assembly fixtures of FIGS. 5-8. A substrate for an integrated circuit package, such as a flip chip integrated circuit package, having excess material to be detached during the assembly process of an integrated circuit package, such as a BGA package, is formed at a step 1002. The excess material may be designated and formed in such a way so as to enable easy detachment or removal, for example by cutting or punching, of the excess material. The substrate having excess material is coupled to a first assembly fixture at a step 1004. A second assembly fixture is attached to the first assembly fixture at a step 1006. An integrated circuit die having a plurality of solder bumps is attached to the substrate at a step 1008. The plurality of solder balls of the integrated circuit die is reflowed at a step 1010. A lid is attached to the substrate at a step 1012. The second assembly fixture is then removed at a step 1014. The substrate having an integrated circuit die and lid from the first assembly fixture is removed at a step 1016. The excess substrate material is detached at a step 1018. Finally, solder balls may be attached to the bottom contacts of the substrate at a step 1020.

It can therefore be appreciated that the new and novel integrated circuit package and method and method of forming an integrated circuit package has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A method of assembling a flip chip integrated circuit package, the method comprising the steps of:
    providing a substrate having excess material to be detached during an assembly process;
    coupling the excess material of the substrate to a first assembly fixture;
    attaching an integrated circuit die having a plurality of solder bumps to contact pads on the substrate;
    reflowing the plurality of solder bumps on the integrated circuit die;
    attaching a lid to the substrate; and detaching the excess material from the substrate after attaching a lid to the substrate.

2. The method of claim 1 wherein coupling the excess material of the substrate to a first assembly fixture comprises attaching the excess material of the substrate to a plurality of coupling members.

3. The method of claim 1 further comprising attaching a second assembly fixture to the first assembly fixture.

4. The method of claim 3 wherein attaching a second assembly fixture to the first assembly fixture comprises attaching the second assembly fixture to a plurality of coupling members of the first assembly fixture to secure the substrate between the first assembly fixture and the second assembly fixture.

5. The method of claim 1 wherein attaching an integrated circuit die to contact pads on the substrate comprises attaching the integrated circuit die through a window in the second assembly fixture.

6. The method of claim 1 wherein attaching a lid to the substrate comprises attaching the lid through a window in a second assembly fixture.

7. A method of assembling a flip chip integrated circuit package, the method comprising the steps of:
    providing a substrate having excess material to be detached during an assembly process;
    coupling the excess material of the substrate to a first assembly fixture;
    attaching a second assembly fixture to the first assembly fixture;
    attaching an integrated circuit die having a plurality of solder bumps to contact pads on the substrate;
    reflowing the plurality of solder bumps on the integrated circuit die; and
    detaching the excess material from the substrate.

8. The method of claim 7 wherein coupling the excess material of the substrate to a first assembly fixture comprises attaching the excess material of the substrate to a plurality of coupling members of the first assembly fixture.

9. The method of claim 8 wherein attaching a second assembly fixture to the first assembly fixture comprises attaching the second assembly fixture to the plurality of coupling members to secure the substrate between the first assembly fixture and the second assembly fixture.

10. The method of claim 7 wherein attaching an integrated circuit die to contact pads on the substrate comprises attaching an integrated circuit die through a window in the second assembly fixture.

11. The method of claim 10 further comprising attaching a lid to the substrate through the window in the second assembly fixture.

12. The method of claim 7 further comprising attaching a lid to the substrate before detaching the excess material from the substrate.

13. The method of claim 7 wherein detaching the excess material from the substrate comprises cutting the excess material from the substrate.

14. A method of assembling a flip chip integrated circuit package, the method comprising the steps of:

providing a substrate having excess material to be detached during an assembly process;

coupling the excess material of the substrate to a first assembly fixture;

attaching an integrated circuit die having a plurality of solder bumps to contact pads on the substrate;

reflowing the plurality of solder bumps on the integrated circuit die;

attaching a lid to the substrate; and detaching the excess material from the substrate.

15. The method of claim 14 further comprising attaching a second assembly fixture to the first assembly fixture to secure the substrate between the first assembly fixture and the second assembly fixture.

16. The method of claim 15 wherein attaching a second assembly fixture to the first assembly fixture comprises attaching the second assembly fixture to a plurality of prongs of the first assembly fixture to secure the substrate between the first assembly fixture and the second assembly fixture.

17. The method of claim 14 wherein attaching a lid to the substrate comprises attaching the lid through a window in the second assembly fixture.

18. The method of claim 14 wherein providing a substrate having excess material to be detached during an assembly process comprises providing a substrate having recesses between areas of the substrate to be detached.

19. The method of claim 18 wherein detaching the excess material from the substrate comprises cutting the areas of the substrate to be detached.

* * * * *